United States Patent
Oooka et al.

(10) Patent No.: US 8,928,045 B2
(45) Date of Patent: Jan. 6, 2015

(54) SEMICONDUCTOR DEVICE

(71) Applicant: Panasonic Corporation, Osaka (JP)

(72) Inventors: Masato Oooka, Toyama (JP); Osamu Matsui, Toyama (JP); Shuji Tsujino, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 71 days.

(21) Appl. No.: 13/690,995

(22) Filed: Nov. 30, 2012

(65) Prior Publication Data

US 2013/0087836 A1    Apr. 11, 2013

Related U.S. Application Data

(63) Continuation of application No. PCT/JP2011/001068, filed on Feb. 24, 2011.

(30) Foreign Application Priority Data

Jun. 7, 2010 (JP) .................................. 2010-130147

(51) Int. Cl.
*H01L 29/66* (2006.01)
*H01L 27/088* (2006.01)
*H01L 27/06* (2006.01)
*H01L 27/098* (2006.01)
*H01L 29/06* (2006.01)
*H01L 29/732* (2006.01)
*H01L 29/808* (2006.01)

(52) U.S. Cl.
CPC .......... *H01L 27/088* (2013.01); *H01L 27/0623* (2013.01); *H01L 27/098* (2013.01); *H01L 29/0692* (2013.01); *H01L 29/66272* (2013.01); *H01L 29/66901* (2013.01); *H01L 29/7322* (2013.01); *H01L 29/808* (2013.01)

USPC ........................... 257/287; 257/504; 438/186

(58) Field of Classification Search
CPC ..................... H01L 29/8086; H01L 29/41766; H01L 29/66893
USPC .................................. 257/287, 504; 438/186
See application file for complete search history.

(56) References Cited

U.S. PATENT DOCUMENTS 4,683,485 A * 7/1987 Schrantz ........................ 257/285
5,151,759 A * 9/1992 Vinal ............................. 257/348

(Continued)

FOREIGN PATENT DOCUMENTS

JP          49-40484           4/1974
JP          51-006683 A        1/1976

(Continued)

OTHER PUBLICATIONS

International Search Report mailed May 31, 2011 issued in corresponding International Application No. PCT/JP2011/001068.

*Primary Examiner* — Nicholas Tobergte
(74) *Attorney, Agent, or Firm* — McDermott Will & Emery LLP

(57) ABSTRACT

A channel region having a first conductivity type is disposed in a surface portion of a semiconductor substrate. A gate region having a second conductivity type is disposed in a surface portion of the channel region. A first semiconductor region having the second conductivity type is disposed under the channel region. Source/drain regions having the first conductivity type are disposed in parts of the surface portion of the channel region on both sides of the gate region in a channel length direction. Second semiconductor regions each having a high impurity concentration and the second conductivity type are disposed in parts of the semiconductor substrate on both sides of the channel region in a channel width direction.

19 Claims, 12 Drawing Sheets

(56) References Cited

U.S. PATENT DOCUMENTS

| | | | | |
|---|---|---|---|---|
| 5,391,897 | A * | 2/1995 | Nonaka | 257/136 |
| 5,705,835 | A * | 1/1998 | Nishiura et al. | 257/147 |
| 6,201,269 | B1 | 3/2001 | Takano et al. | |
| 6,303,947 | B1 * | 10/2001 | Ueno | 257/77 |
| 6,551,865 | B2 * | 4/2003 | Kumar et al. | 438/137 |
| 7,667,268 | B2 * | 2/2010 | Disney et al. | 257/335 |
| 2001/0009292 | A1 * | 7/2001 | Nishinohara et al. | 257/402 |
| 2009/0039398 | A1 | 2/2009 | Hatamoto et al. | |

FOREIGN PATENT DOCUMENTS

| | | | |
|---|---|---|---|
| JP | 05-175238 | A | 7/1993 |
| JP | 05-326558 | A | 12/1993 |
| JP | 06-084948 | A | 3/1994 |
| JP | 07-335666 | * | 12/1995 |
| JP | 2006-108232 | A | 4/2006 |
| JP | 2009-43923 | A | 2/2009 |
| JP | 2009-158594 | A | 7/2009 |

* cited by examiner

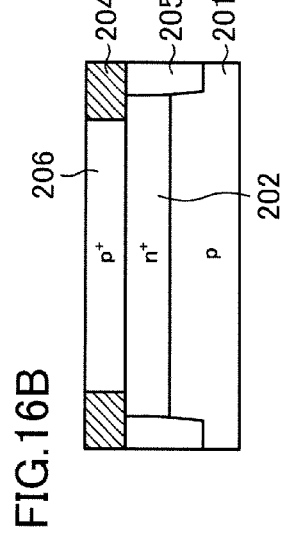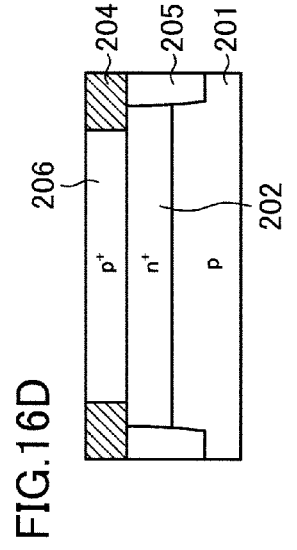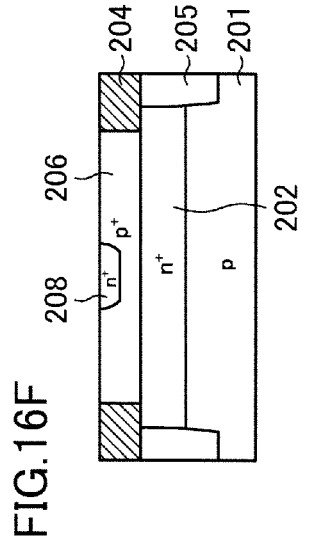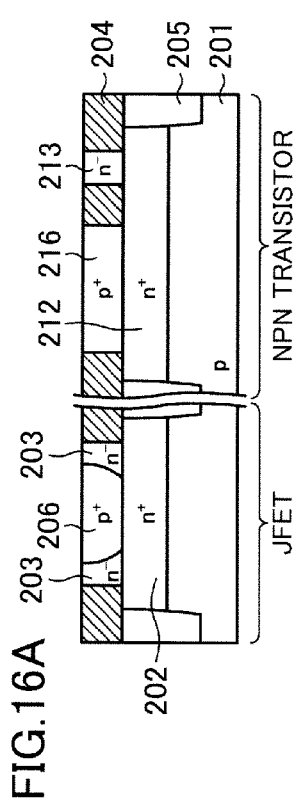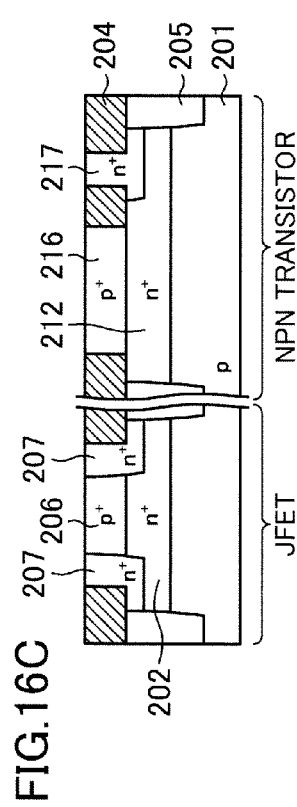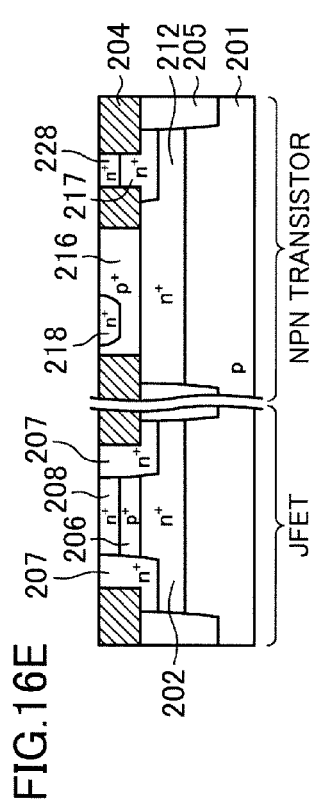

SEMICONDUCTOR DEVICE

CROSS-REFERENCE TO RELATED APPLICATION

This is a continuation of PCT International Application PCT/JP2011/001068 filed on Feb. 24, 2011, which claims priority to Japanese Patent Application No. 2010-130147 filed on Jun. 7, 2010. The disclosures of these applications including the specifications, the drawings, and the claims are hereby incorporated by reference in their entirety.

BACKGROUND

Junction field effect transistors (hereinafter referred to as JFETs) are devices having preferable noise characteristics, and a large number of JFETs are used to configure a low noise circuit.

For stable operation of JFETs, it is important to reduce variations in pinch-off voltage, and to reduce the variations, various methods have been proposed. For example, Japanese Patent Publication No. H06-84948 (hereinafter referred to as Document 1) discloses a configuration in which high-concentration gate regions are disposed above and under a channel region specifically in the first embodiment and in FIGS. 3, 4.

FIG. 18 is a cross-sectional view illustrating a semiconductor device disclosed in Document 1. As illustrated in FIG. 18, an epitaxial layer 3 is formed on an n-type embedded layer 2 on a p-type semiconductor substrate 1. Moreover, an insulating region 4 is formed on the semiconductor substrate 1 to surround the embedded layer 2 and the epitaxial layer 3, and an insulating film 6 is formed on a surface of the epitaxial layer 3. In the epitaxial layer 3, a p-type channel region 8 is embedded, and an n-type upper gate region 9 and an n-type lower gate region 9a are formed with the p-type channel region 8 being vertically interposed therebetween.

With the configuration illustrated in FIG. 18, expansion of a depletion layer can be controlled, so that a JFET having low channel resistance and a low pinch-off voltage can be obtained.

SUMMARY

However, the semiconductor device described above has a problem where highly precise control of the pinch-off voltage becomes difficult as a power supply voltage decreases.

In view of the foregoing, a JFET of the present disclosure will be described below, wherein the JFET of the present disclosure is capable of highly precisely controlling the pinch-off voltage even when the power supply voltage is low.

Inventors of the present application investigated for causes of the problem where in the semiconductor device described above, the highly precise control of the pinch-off voltage becomes difficult as the power supply voltage decreases, and arrived at the following findings.

In the semiconductor device disclosed in Document 1, the two gate regions are formed above and under the channel region, and side surfaces of the channel region are also covered with the two gate regions. Thus, the width of the channel region and impurity concentration distributions in side portions of the channel region may be influenced by variations in three ion implantation processes for forming the channel region and the two gate regions. Moreover, in the semiconductor device disclosed in Document 1, in order to form the channel region, impurity concentrations of the gate regions near the side surfaces of the channel region have to be lower than the impurity concentration of the channel region. Thus, it may become difficult to control the expansion of the depletion layer in the horizontal direction.

Due to the causes described above, in the semiconductor device disclosed in Document 1, the highly precise control of the pinch-off voltage becomes difficult as the power supply voltage decreases.

In view of the findings described above, the present disclosure was devised.

A first semiconductor device according to the present disclosure includes: a channel region disposed in a surface portion of a semiconductor substrate and having a first conductivity type; a first semiconductor region disposed under the channel region in the semiconductor substrate and having a second conductivity type; a gate region disposed in a surface portion of the channel region and having the second conductivity type; and source/drain regions disposed in parts of the surface portion of the channel region on both sides of the gate region in a channel length direction and having the first conductivity type, wherein second semiconductor regions having a higher impurity concentration than the first semiconductor region and having the second conductivity type are further disposed in parts of the semiconductor substrate on both sides of the channel region in a channel width direction, and the second semiconductor regions each have a shallower depth than the first semiconductor region.

In the first semiconductor device according to the present disclosure, the second semiconductor regions, each of which has the second conductivity type and a higher impurity concentration than the first semiconductor region, are separately disposed on the both sides of the channel region in the channel width direction, wherein the first semiconductor region has the second conductivity type and are disposed under the channel region having the first conductivity type. That is, both side surfaces of the channel region are defined by the second semiconductor regions having a high impurity concentration and an opposite conductivity type. Thus, it is possible to avoid or reduce the occurrence of a situation in which the width of the channel region and impurity concentration distributions in side portions of the channel region are influenced by variations in ion implantation for forming the first semiconductor region and the gate region which vertically sandwich the channel region. Moreover, the impurity concentration in the first semiconductor region under the channel region can be set to a low value, and thus it is not necessary to increase the impurity concentration of the channel region itself. As a result, it is possible to prevent reduction of impurity concentrations in the second semiconductor regions near the side surfaces of the channel region, so that it is possible to highly precisely control expansion of a depletion layer in the horizontal direction.

Thus, even at a low power supply voltage, the expansion of the depletion layer in the channel region in the vertical and horizontal direction is ensured, so that it is possible to obtain a JFET capable of highly precisely controlling a pinch-off voltage. Moreover, the impurity concentration of the channel region itself can be set to a low value, which enables depletion of the channel region at a low gate voltage, so that the pinch-off voltage can be reduced.

In the first semiconductor device according to the present disclosure, when the second semiconductor regions are each formed to have a greater depth than the channel region, the advantages mentioned above can be ensured. In this case, when the second semiconductor regions are each formed to have a shallower depth than the first semiconductor region, the breakdown voltage of the JFET can be increased.

In the first semiconductor device according to the present disclosure, the gate region may be spaced apart from the source/drain regions. With this configuration, suitably setting the space between the gate region and the source/drain regions can increase the breakdown voltage while an increase in on-resistance is reduced. In this case, part of the channel region may lie between the gate region and the source/drain regions.

In the first semiconductor device according to the present disclosure, when the second semiconductor regions are spaced apart from the source/drain regions, the breakdown voltage of the JFET can be increased.

In the first semiconductor device according to the present disclosure, when the size of the channel width direction in the source/drain regions is larger than the size of the gate region in the channel width direction, the breakdown voltage of the JFET can be improved.

In the first semiconductor device according to the present disclosure, the impurity concentration of the gate region may be higher than the impurity concentration of the first semiconductor region. In this case, when the peak value of the impurity concentration of the gate region is substantially equal to the peak value of the impurity concentration of the second semiconductor regions, control of the expansion of the depletion layer can be ensured.

The first semiconductor device according to the present disclosure may further include a bipolar transistor disposed on the semiconductor substrate. In this case, when the channel region and a base region of the bipolar transistor are formed in an identical step, a semiconductor device including the JFET of the present disclosure and the bipolar transistor can be obtained without increasing the number of steps. Moreover, when the second semiconductor regions and a collector region of the bipolar transistor are formed in an identical step, a semiconductor device including the JFET of the present disclosure and the bipolar transistor can be obtained without increasing the number of steps. Further, when the gate region and an emitter region of the bipolar transistor are formed in an identical step, a semiconductor device including the JFET of the present disclosure and the bipolar transistor can be obtained without increasing the number of steps. Furthermore, when the source/drain regions and a base contact region of the bipolar transistor are formed in an identical step, a semiconductor device including the JFET of the present disclosure and the bipolar transistor can be obtained without increasing the number of steps.

A second semiconductor device according to the present disclosure includes: a channel region disposed in a surface portion of a semiconductor substrate and having a first conductivity type; a gate region disposed in a surface portion of the channel region and having a second conductivity type; and source/drain regions disposed in parts of the surface portion of the channel region on both sides of the gate region in a channel length direction and having the first conductivity type, wherein semiconductor regions having a higher impurity concentration than the channel region and having the second conductivity type are disposed in parts of the semiconductor substrate on both sides of the channel region in a channel width direction, and an embedded region having a higher impurity concentration than the channel region and having the second conductivity type is disposed under the channel region in the semiconductor substrate.

In the second semiconductor device according to the present disclosure, the semiconductor regions, each of which has the second conductivity type and a higher impurity concentration than the channel region having the first conductivity type, are separately disposed on both sides of the channel region in the channel width direction, and the embedded region, which has the second conductivity type and a higher impurity concentration than the channel region having the first conductivity type, is separately disposed under the channel region. That is, an upper surface of the channel region is defined by the gate region having a high impurity concentration and an opposite conductivity type, both side surfaces of the channel region are defined by the semiconductor regions each having a high impurity concentration and an opposite conductivity type, and further, a bottom surface of the channel region is defined by the embedded region having a high impurity concentration and an opposite conductivity type. Thus, it is possible to avoid or reduce the occurrence of a situation in which the width of the channel region and impurity concentration distributions in side portions of the channel region are influenced by variations in ion implantation for forming the embedded region and the gate region which vertically sandwich the channel region. Moreover, the channel region can be surrounded in the vertical and horizontal directions by the regions having a higher impurity concentration than the channel region and having an opposite conductivity type, which ensures expansion of the depletion layer in the vertical and horizontal directions of the channel region even at a low power supply voltage, so that it is possible to highly precisely control the pinch-off voltage. Furthermore, the channel region is surrounded in the vertical and horizontal directions by the regions having a high impurity concentration and having an opposite conductivity type, which enables depletion of the channel region at a low gate voltage, so that it is possible to reduce the pinch-off voltage.

In particular, in a JFET structure having a shallow channel depth and a large channel width, the expansion of the depletion layer on the bottom surface of the channel region significantly influences variations in pinch-off voltage. Thus, the advantages described above are particularly significantly achieved by using a configuration as in the second semiconductor device of the present disclosure in which not only on the both side surfaces of the channel region but also on the bottom surface of the channel region, an impurity region having an opposite conductivity type and a high concentration is disposed.

In the second semiconductor device according to the present disclosure, when the semiconductor regions are each formed to have a greater depth than the channel region, the advantages described above can be ensured. In this case, the semiconductor regions may each be formed to have a shallower depth than the embedded region, or the semiconductor regions may each be formed to have a greater depth than the embedded region.

In the second semiconductor device according to the present disclosure, the gate region may be spaced apart from the source/drain regions. With this configuration, suitably setting the space between the gate region and the source/drain regions can increase the breakdown voltage while an increase in on-resistance is reduced. In this case, part of the channel region may lie between the gate region and the source/drain regions.

In the second semiconductor device according to the present disclosure, when the semiconductor regions are spaced apart from the source/drain regions, the breakdown voltage of the JFET can be increased.

In the second semiconductor device according to the present disclosure, when the size of the source/drain regions in the channel width direction is larger than the size of the gate region in the channel width direction, the breakdown voltage of the JFET can be improved.

In the second semiconductor device according to the present disclosure, when the impurity concentration of the gate region is higher than the impurity concentration of the channel region, the advantages described above can be ensured. In this case, when the peak value of the impurity concentration of the gate region is substantially equal to the peak value of the impurity concentration of the semiconductor regions, control of the expansion of the depletion layer can be ensured.

The second semiconductor device according to the present disclosure may further include a bipolar transistor disposed on the semiconductor substrate. In this case, when the embedded region and the embedded region of the bipolar transistor are formed in an identical step, a semiconductor device including the JFET of the present disclosure and the bipolar transistor can be obtained without increasing the number of steps. Moreover, when the channel region and a base region of the bipolar transistor are formed in an identical step, a semiconductor device including the JFET of the present disclosure and the bipolar transistor can be obtained without increasing the number of steps. Here, the channel region and the base region may be formed in a semiconductor layer epitaxially grown on the semiconductor substrate. Moreover, when the semiconductor regions and a collector region of the bipolar transistor are formed in an identical step, a semiconductor device including the JFET of the present disclosure and the bipolar transistor can be obtained without increasing the number of steps. Further, when the gate region and an emitter region of the bipolar transistor are formed in an identical step, a semiconductor device including the JFET of the present disclosure and the bipolar transistor can be obtained without increasing the number of steps. Furthermore, when the source/drain regions and a base contact region of the bipolar transistor are formed in an identical step, a semiconductor device including the JFET of the present disclosure and the bipolar transistor can be obtained without increasing the number of steps.

According to the present disclosure, the expansion of the depletion layer in the channel region in the vertical and horizontal directions can be ensured, so that it is possible to obtain a JFET capable of highly precisely controlling a pinch-off voltage. Moreover, depletion of the channel region is enabled at a low gate voltage, so that the pinch-off voltage can be reduced.

BRIEF DESCRIPTION OF THE DRAWINGS

FIGS. 16A-16F are cross-sectional views illustrating steps in the method for fabricating the semiconductor device according to the second embodiment.

DETAILED DESCRIPTION (First Embodiment)

Figure 1:
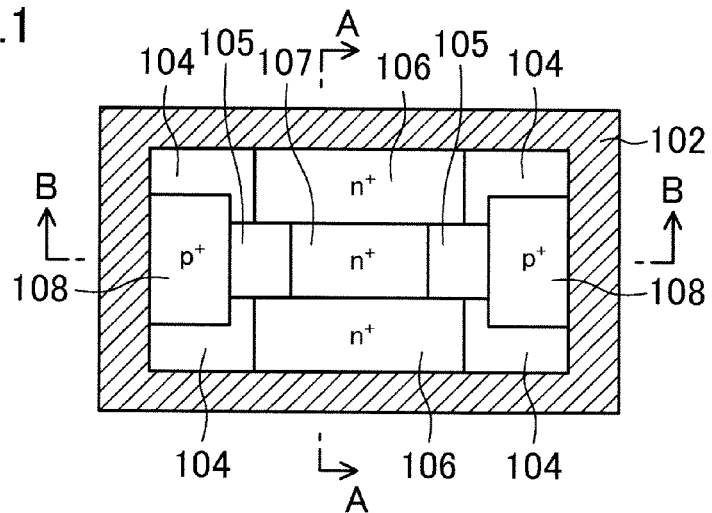
FIG. 1 is a plan view illustrating a semiconductor device according to a first embodiment.

An example semiconductor device according to a first embodiment of the present disclosure will be described below with reference to the drawings. In the drawings, like reference characters have been used to designate identical or equivalent elements.

Figure 2A:
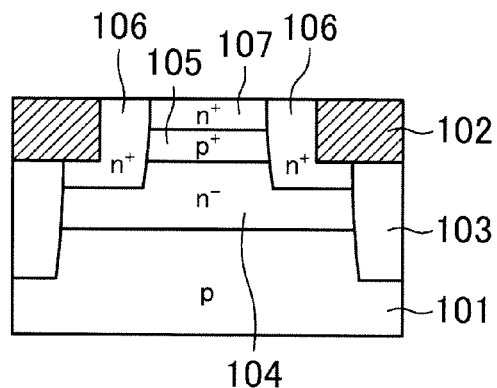
FIG. 2A is a cross-sectional view along the line A-A of FIG. 1.

FIG. 1 is a plan view illustrating a semiconductor device according to the present embodiment, and specifically, a semiconductor device including a JFET. FIG. 2A is a cross-sectional view along the line A-A of FIG. 1, and FIG. 2B is a cross-sectional view along the line B-B of FIG. 1.

Figure 2B:
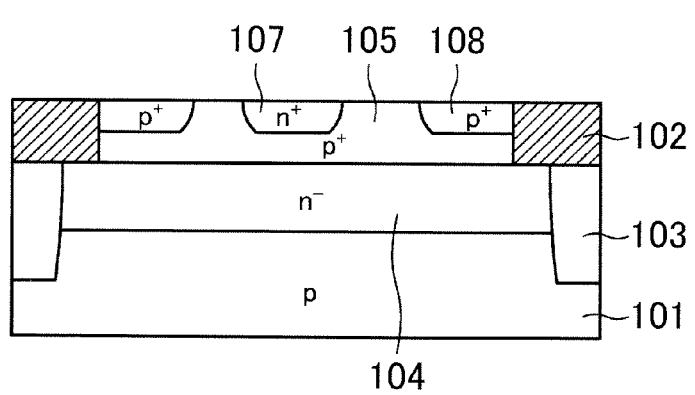
FIG. 2B is a cross-sectional view along the line B-B of FIG. 1.

As illustrated in FIG. 1 and FIGS. 2A, 2B, the semiconductor device according to the present embodiment includes a p-type channel region 105 formed in a surface portion of a p-type semiconductor substrate 101. A first n-type semiconductor region 104 is formed under the p-type channel region 105 in the p-type semiconductor substrate 101. An n-type gate region 107 is formed in a surface portion of the p-type channel region 105. P-type source/drain regions 108 are formed in parts of the surface portion of the p-type channel region 105 on both sides of the n-type gate region 107 in a channel length direction.

Moreover, in the present embodiment, second n-type semiconductor regions 106 each having a higher impurity concentration than the first n-type semiconductor region 104 are formed in parts of the p-type semiconductor substrate 101 on both sides of the p-type channel region 105 in a channel width direction.

Note that in the surface portion of the p-type semiconductor substrate 101, an insulating film 102 is embedded to surround the p-type channel region 105, the second n-type semiconductor regions 106 (except bottom sections), the n-type gate region 107, and the p-type source/drain regions 108. Moreover, an isolation region 103 made of, for example, a low-concentration p-type semiconductor region is disposed under the insulating film 102 in the p-type semiconductor substrate 101 to surround the first n-type semiconductor region 104 and the bottom sections of the second n-type semiconductor regions 106.

In the present embodiment, the p-type semiconductor substrate 101 is, for example, a p-type silicon substrate, and has an impurity concentration of about $4 \times 10^{15}$ cm$^{-3}$. The first n-type semiconductor region 104 is, for example, an n-type layer formed by implanting and diffusing ions of an n-type impurity into the surface portion of the p-type semiconductor substrate 101, and has an impurity concentration of about $1 \times 10^{16}$ cm$^{-3}$. Here, the first n-type semiconductor region 104 is defined by the isolation region 103 to be island-shaped, the isolation region 103 extending into the p-type semiconductor substrate 101. The p-type channel region 105 is a p-type layer formed by implanting a p-type impurity into a surface portion of the first n-type semiconductor region 104, and has an impurity concentration of about $1 \times 10^{18}$ cm$^{-3}$. The second n-type semiconductor regions 106 are made of, for example, an n-type layer formed by implanting an n-type impurity into parts of the p-type semiconductor substrate 101 on the both sides of the p-type channel region 105 in the channel width direction, and each have an impurity concentration of about $1 \times 10^{19}$ cm$^{-3}$ and a greater depth than the p-type channel region 105. The n-type gate region 107 is, for example, an n-type layer formed by implanting an n-type impurity into the surface portion of the p-type channel region 105, and has an impurity concentration of about $1 \times 10^{19}$ cm$^{-3}$. The p-type source/drain regions 108 are made of, for example, a p-type layer formed by implanting a p-type impurity into parts of the surface portion of the p-type channel region 105 on the both sides of the n-type gate region 107 in the channel length direction, and each have an impurity concentration of about $1 \times 10^{19}$ cm$^{-3}$.

Figure 3:
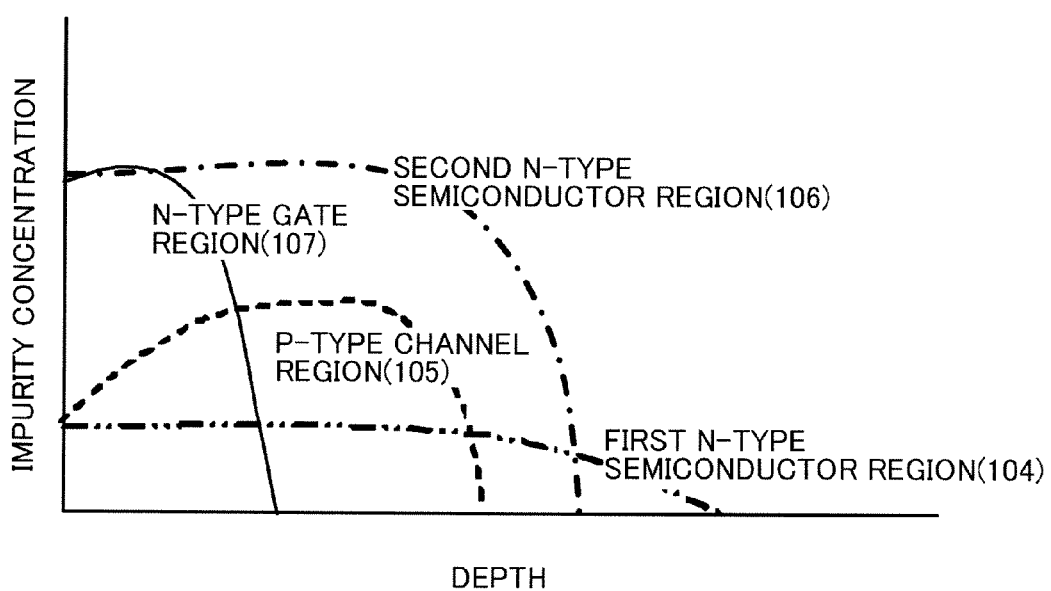
FIG. 3 is a view illustrating impurity concentration distributions in a depth direction of impurity regions of the semiconductor device according to the first embodiment.

FIG. 3 shows impurity concentration distributions in a depth direction of the first n-type semiconductor region 104, the second n-type semiconductor regions 106, the p-type channel region 105, and the n-type gate region 107 in the semiconductor device according to the present embodiment. As illustrated in FIG. 3, in the present embodiment, the impurity concentration of each of the second n-type semiconductor regions 106 is higher than the impurity concentration of the first n-type semiconductor region 104.

According to the present embodiment described above, the second n-type semiconductor regions 106 each having a higher impurity concentration than the first n-type semiconductor region 104 formed under the p-type channel region 105 are formed on the both sides of the p-type channel region 105 in the channel width direction. That is, both side surfaces of the p-type channel region 105 are defined by the second n-type semiconductor regions 106 each having a high impurity concentration and an opposite conductivity type. Thus, it is possible to avoid or reduce the occurrence of a situation in which the width of the p-type channel region 105 and impurity concentration distributions in side portions of the p-type channel region 105 are influenced by variations in ion implantation for forming the first n-type semiconductor region 104 and the n-type gate region 107 which vertically sandwich the p-type channel region 105. Moreover, the impurity concentration of the first n-type semiconductor region 104 under the p-type channel region 105 can be set to a low value, so that it is not necessary to increase the impurity concentration of the p-type channel region 105 itself. As a result, it is possible to prevent reduction of impurity concentrations of the second n-type semiconductor regions 106 near the side surfaces of the p-type channel region 105, so that it is possible to highly precisely control expansion of a depletion layer in the horizontal direction.

Thus, according to the present embodiment, the expansion of the depletion layer in the vertical and horizontal directions in the p-type channel region 105 can be ensured even at a low power supply voltage, so that a JFET capable of highly precisely controlling a pinch-off voltage can be obtained. Moreover, the impurity concentration of the p-type channel region 105 itself can be set to a low value, which enables depletion of the p-type channel region 105 at a low gate voltage, so that the pinch-off voltage can be reduced.

Figure 4:
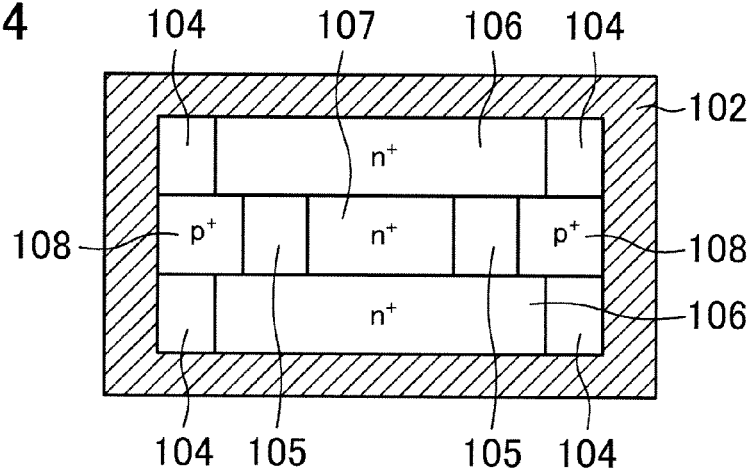
FIG. 4 is a plan view illustrating a semiconductor device according to a variation of the first embodiment.

Note that in the present embodiment, the second n-type semiconductor regions 106 may be spaced apart from the p-type source/drain regions 108. With this configuration, the breakdown voltage of the JFET can be increased. Alternatively, the size of the p-type source/drain regions 108 in the channel width direction may be larger than the size of the n-type gate region 107 in the channel width direction. With this configuration, the breakdown voltage of the JFET can be increased. Note that when it is not necessary to increase the breakdown voltage, for example, as illustrated in FIG. 4 (a variation of the configuration illustrated in the plan view in FIG. 1), the second n-type semiconductor regions 106 may be in contact with the p-type source/drain regions 108, or the size of the n-type gate region 107 in the channel width direction may be substantially equal to the size of the p-type source/drain regions 108 in the channel width direction.

Alternatively, in the present embodiment, the n-type gate region 107 may be spaced apart from the p-type source/drain regions 108. With this configuration, suitably setting the space between the n-type gate region 107 and the p-type source/drain regions 108 can increase the breakdown voltage while an increase in on-resistance is reduced. In this case, part of the p-type channel region 105 may lie between the n-type gate region 107 and the p-type source/drain regions 108 as in the present embodiment.

Figure 5:
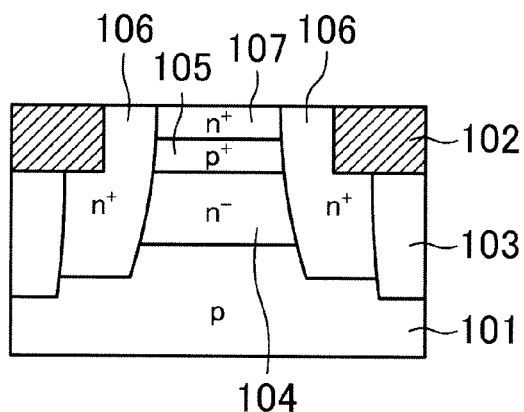
FIG. 5 is a cross-sectional view of a semiconductor device according to a variation of the first embodiment.

Alternatively, in the present embodiment, the second n-type semiconductor regions 106 may each be formed to have a greater depth than the p-type channel region 105. With this configuration, the advantages described above can be ensured. In this case, when the second n-type semiconductor regions 106 are each formed to have a shallower depth than the first n-type semiconductor region 104, the breakdown voltage of the JFET can be increased. Note that when it is not necessary to increase the breakdown voltage, for example, as illustrated in FIG. 5 (a variation of the cross-sectional configuration of FIG. 2A), the second n-type semiconductor regions 106 may each have a greater depth than the first n-type semiconductor region 104.

Figure 6:
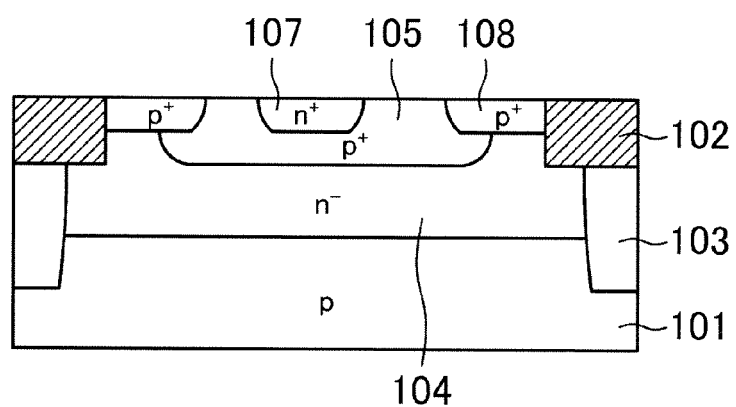
FIG. 6 is a cross-sectional view of a semiconductor device according to a variation of the first embodiment.

In the present embodiment, the p-type channel region 105 lies between the first n-type semiconductor region 104 and the p-type source/drain regions 108 as illustrated in FIG. 2B. However, alternatively, as illustrated in FIG. 6 (a variation of the cross-sectional configuration of FIG. 2B), part of the p-type source/drain regions 108 may be in contact with the first n-type semiconductor region 104.

In the present embodiment, the insulating film 102 is embedded in the surface portion of the p-type semiconductor substrate 101 to a depth that is substantially equal to the depth of the p-type channel region 105. However, alternatively, the insulating film 102 may be embedded to a depth greater than or shallower than the depth of the p-type channel region 105.

In the present embodiment, the isolation region 103 made of a low-concentration p-type semiconductor region is disposed under the insulating film 102 in the p-type semiconductor substrate 101, but instead of the isolation region 103, for example, an isolation region made of an undoped polysilicon region covered with a silicon oxide film may be disposed.

Alternatively, in the present embodiment, for example, as illustrated in FIG. 3, the impurity concentration of the n-type gate region 107 may be higher than the impurity concentration of the first n-type semiconductor region 104. Moreover, in this case, for example, as illustrated in FIG. 3, the peak value of the impurity concentration of the n-type gate region 107 may be substantially equal to the peak value of the impurity concentration of the second n-type semiconductor regions 106. With this configuration, the control of the expansion of the depletion layer can be ensured.

In the present embodiment, the p-type semiconductor substrate 101 is used, but an intrinsic semiconductor substrate or insulating substrate which includes a p-type semiconductor region formed on its surface may be used instead of the p-type semiconductor substrate 101.

In the present embodiment, the channel region and the source/drain regions each have a p-type conductivity, and the gate region and the semiconductor regions under and on the sides of the channel region each have an n-type conductivity. However, alternatively, the channel region and the source/drain regions may each have the n-type conductivity, and the gate region and semiconductor regions under and on the sides of the channel region may each have the p-type conductivity. This configuration also provides advantages similar to those of the present embodiment.

Moreover, it is clearly understood that in the present embodiment, detailed conditions such as presence of a surface protective film in performing ion implantation, the type and thickness of a mask material, and the type and thickness of an interlayer insulating film are not particularly limited.

A method for fabricating a semiconductor device according to the present embodiment will be described below with reference to the drawings, where a configuration in which the above-described JFET of the present embodiment and an NPN bipolar transistor are formed on an identical substrate is taken as an example.

In the method for fabricating the semiconductor device according to the present embodiment, the second n-type semiconductor regions 106 located on both sides of the p-type channel region 105 in the channel width direction of the JFET of the present embodiment of FIG. 1 and FIGS. 2A, 2B are formed simultaneously with a collector region of the NPN bipolar transistor by implanting an n-type impurity. This provides advantages that the JFET of the present embodiment and the NPN bipolar transistor can be formed simultaneously without adding a new step.

FIGS. 7A-7F and FIGS. 8A-8F are cross-sectional views illustrating steps in the method for fabricating the semiconductor device according to the present embodiment. FIGS. 7A, 7C, 7E and FIGS. 8A, 8C, 8E illustrate a cross-sectional configuration of the JFET in the channel width direction together with a cross-sectional configuration of the NPN bipolar transistor. FIGS. 7B, 7D, 7F and FIGS. 8B, 8D, 8F illustrate a cross-sectional configuration of the JFET in the channel length direction. Note that in FIGS. 7A-7F and FIGS. 8A-8F, the same reference numerals as those in FIG. 1 and FIGS. 2A, 2B are used to represent equivalent elements of the semiconductor device of the embodiments illustrated FIG. 1 and FIGS. 2A, 2B.

Figure 7B:
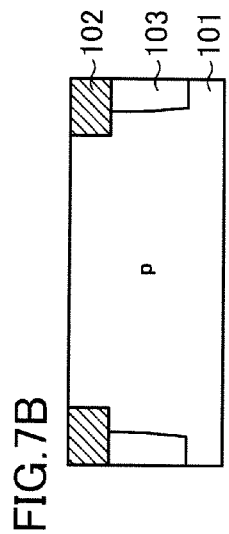
FIGS. 7A-7F are cross-sectional views illustrating steps in a method for fabricating the semiconductor device according to the first embodiment.
Figure 7D:
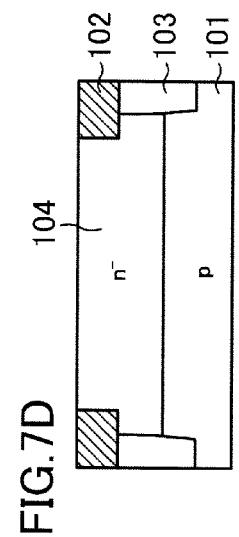
Figure 7F:
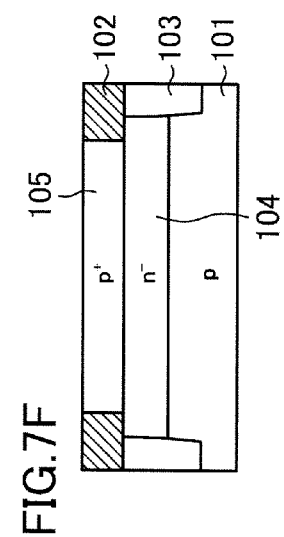
Figure 7A:
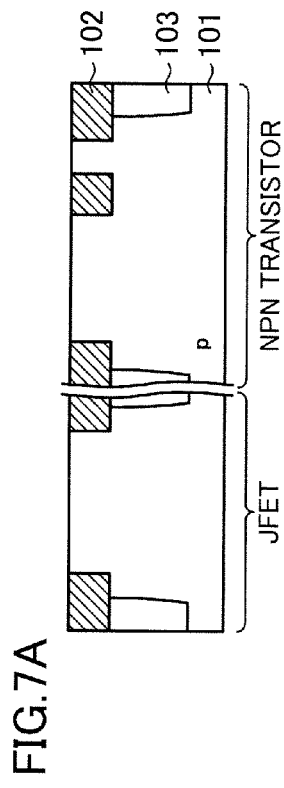

In the present embodiment, first, in a first step, as illustrated in FIGS. 7A and 7B, an insulating film 102 is embedded in a surface portion in a predetermined region of a p-type semiconductor substrate 101, and an isolation region 103 is formed under the insulating film 102 in the p-type semiconductor substrate 101 by using, for example, a processing technique such as trench etching. Thus, a JFET formation region is electrically isolated from an NPN bipolar transistor formation region.

Figure 7C:
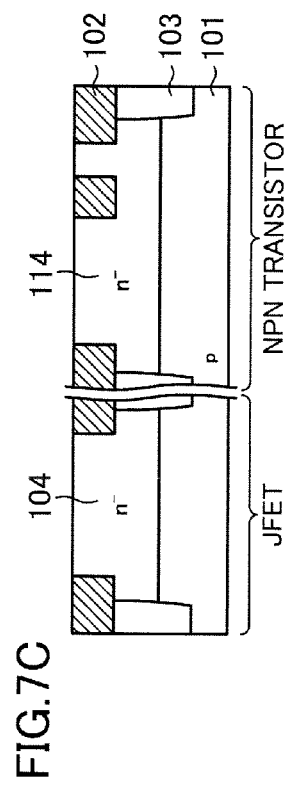

Next, in a second step, as illustrated in FIGS. 7C and 7D, ions of an n-type impurity are implanted into the entire surface of the p-type semiconductor substrate 101 under the conditions, for example, that a dose amount is $1 \times 10^{12}$ cm$^{-2}$, and an implantation energy is 300 keV, and then for example, a thermal treatment is performed at 1000° C. for 60 minutes to diffuse the implanted impurity. Thus, a first n-type semiconductor region 104 is formed in a surface portion of the p-type semiconductor substrate 101 of the JFET formation region, and an n-type semiconductor region 114 is formed in a surface portion of the p-type semiconductor substrate 101 of the NPN bipolar transistor formation region.

Figure 7E:
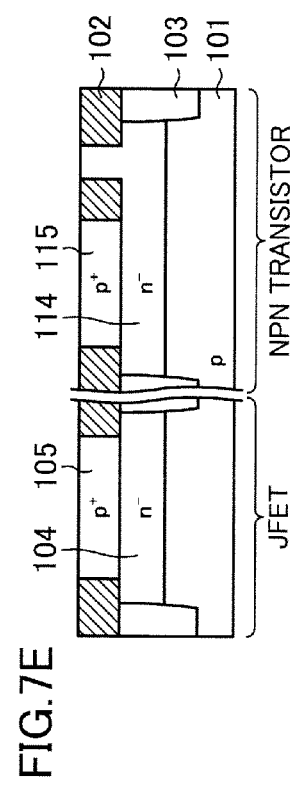

Next, in a third step, as illustrated in FIGS. 7E and 7F, ions of a p-type impurity are selectively implanted into a surface portion of the first n-type semiconductor region 104 of the JFET formation region and a surface portion of the n-type semiconductor region 114 of the NPN bipolar transistor formation region under the conditions, for example, that the dose amount is $2 \times 10^{12}$ cm$^{-2}$, and the implantation energy is 40 keV. Thus, a p-type channel region 105 is formed in the surface portion of the first n-type semiconductor region 104 of the JFET formation region, and a p-type base region 115 is formed in the surface portion of the n-type semiconductor region 114 of the NPN bipolar transistor formation region.

Figure 8B:
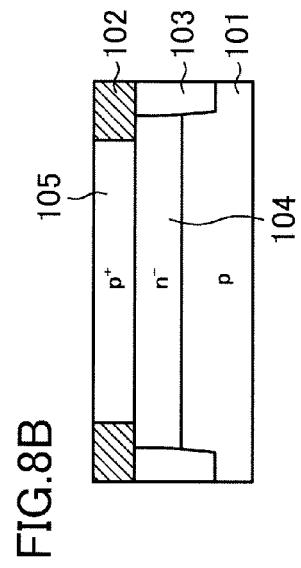
FIGS. 8A-8F are cross-sectional views illustrating steps in the method for fabricating the semiconductor device according to the first embodiment.
Figure 8D:
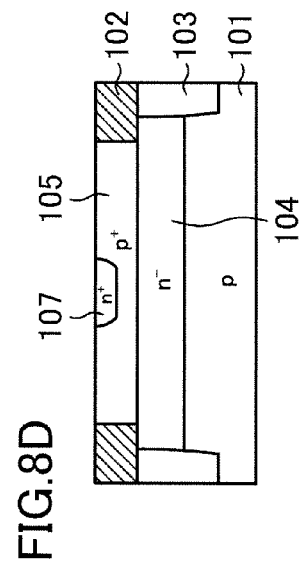
Figure 8F:
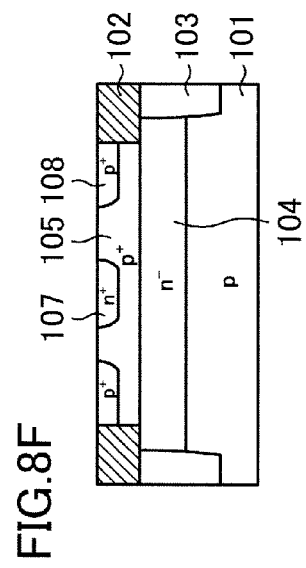
Figure 8A:
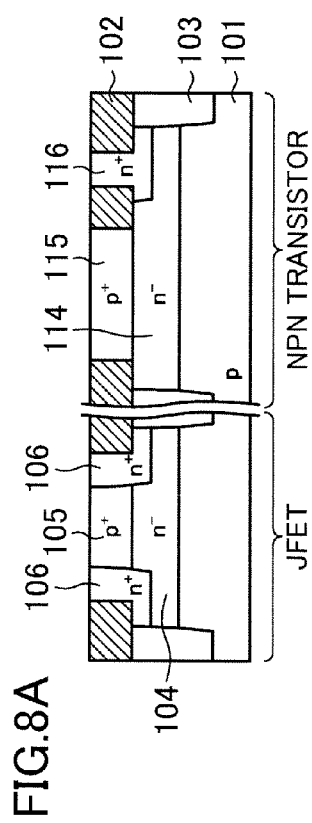

Next, in a fourth step, as illustrated in FIGS. 8A and 8B, ions of an n-type impurity are selectively implanted into both end portions of the first n-type semiconductor region 104 and the p-type channel region 105 in the channel width direction of the JFET formation region and a part of the n-type semiconductor region 114 of the NPN bipolar transistor formation region in which the p-type base region 115 is not formed under the conditions, for example, that the dose amount is $5 \times 10^{15}$ cm$^{-2}$, and the implantation energy is 80 keV. Thus, second n-type semiconductor regions 106 are formed in the both end portions of the p-type channel region 105 in the channel width direction of the JFET formation region to have a greater depth than the p-type channel region 105, and an n-type collector region 116 is formed in the part of the n-type semiconductor region 114 of the NPN bipolar transistor formation region in which the p-type base region 115 is not formed.

Figure 8C:
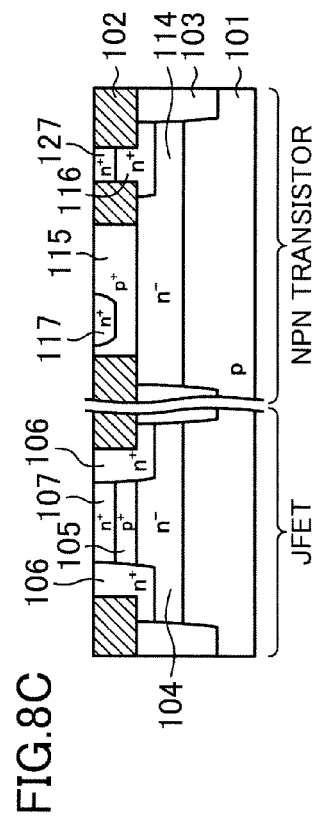

Next, in a fifth step, as illustrated in FIGS. 8C and 8D, ions of an n-type impurity are selectively implanted into a surface portion of the p-type channel region 105 of the JFET formation region and surface portions of the p-type base region 115 and the n-type collector region 116 of the NPN bipolar transistor formation region under the conditions, for example, that the dose amount is $4 \times 10^{15}$ cm$^{-2}$, and the implantation energy is 50 keV. Thus, an n-type gate region 107 is formed in the surface portion of the p-type channel region 105 of the JFET formation region, and an n-type emitter region 117 and an n-type collector contact region 127 are formed in the surface portions of the p-type base region 115 and the n-type collector region 116 of the NPN bipolar transistor formation region.

Figure 8E:
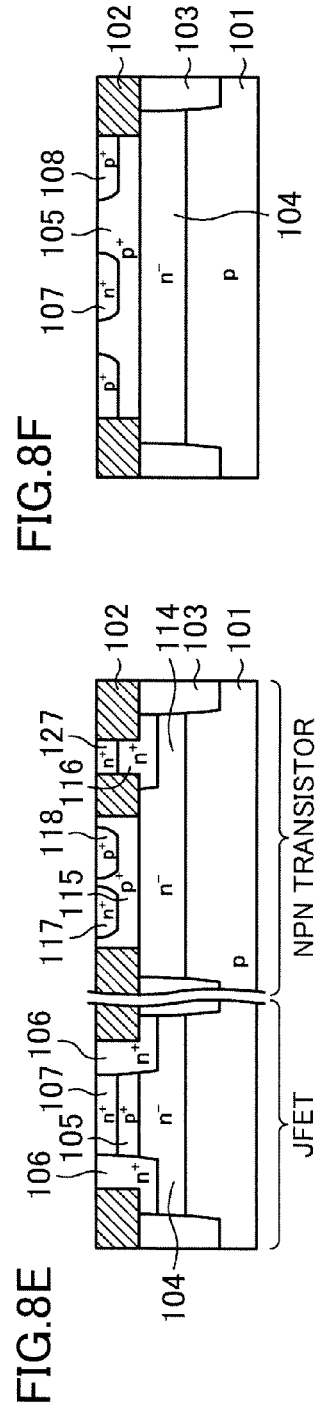

Next, in a sixth step, as illustrated in FIGS. 8E and 8F, ions of a p-type impurity are selectively implanted into parts of the surface portion of the p-type channel region 105 of the JFET formation region on both sides of the n-type gate region 107 in the channel length direction and a part of the surface portion of the p-type base region 115 of the NPN bipolar transistor formation region in which the n-type emitter region 117 is not formed, where the implantation is performed under the conditions, for example, that the dose amount is $4 \times 10^{15}$ cm$^{-2}$, and the implantation energy is 3 keV. Thus, p-type source/drain regions 108 are formed in the parts of the surface portion of the p-type channel region 105 of the JFET formation region on the both sides of the n-type gate region 107 in the channel length direction, and a p-type base contact region 118 is formed in the part of the surface portion of the p-type base region 115 of the NPN bipolar transistor formation region in which the n-type emitter region 117 is not formed.

Through the steps described above, the NPN bipolar transistor including the n-type semiconductor region 114, the p-type base region 115, the n-type collector region 116, the n-type emitter region 117, the n-type collector contact region 127, and the p-type base contact region 118 is formed on the p-type semiconductor substrate 101 together with the JFET of the present embodiment of FIG. 1 and FIGS. 2A, 2B.

As described above, according to the fabrication method in the present embodiment, the second n-type semiconductor regions 106 which are located on both sides of the p-type channel region 105 in the channel width direction of the JFET of the present embodiment, and have a high impurity concentration can be formed simultaneously with the n-type collector region 116 of the NPN bipolar transistor. With this method, a semiconductor device including the JFET of the present embodiment and a bipolar transistor formed on an identical substrate can be obtained without adding a new step.

Note that in the fabrication method in the present embodiment, the channel region and the source/drain regions of the JFET, and the base region and the base contact region of the bipolar transistor each have a p-type conductivity, and the gate region and the semiconductor regions under and on the sides of the channel region of the JFET, and the collector region, the emitter region, and the collector contact region of the bipolar transistor each have an n-type conductivity. However, alternatively, the channel region and the source/drain regions of the JFET and the base region and the base contact region of the bipolar transistor may each have the n-type conductivity, and the gate region and the semiconductor regions under and on the sides of the channel region of the JFET, and the collector region, the emitter region, and the collector contact region of the bipolar transistor may each have the p-type conductivity. This configuration also provides advantages similar to those of the present embodiment. That is, instead of the NPN bipolar transistor, a PNP bipolar transistor may be formed together with the JFET.

Moreover, it is clearly understood that in the fabrication method in the present embodiment, detailed conditions such as presence of a surface protective film in performing ion implantation, the type and thickness of a mask material, and the type and thickness of an interlayer insulating film are not particularly limited.

(Second Embodiment)

Figure 9:
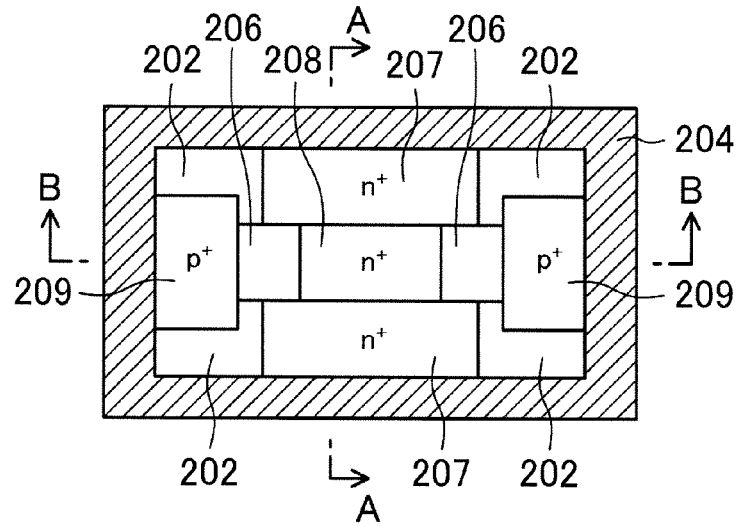
FIG. 9 is a plan view illustrating a semiconductor device according to a second embodiment.
Figure 10A:
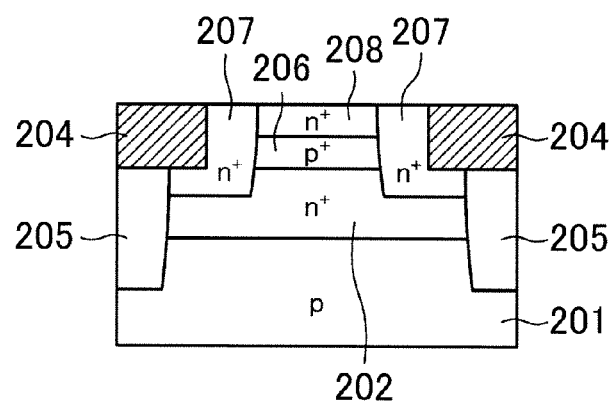
FIG. 10A is a cross-sectional view along the line A-A of FIG. 9.

An example semiconductor device according to a second embodiment of the present disclosure will be described below with reference to the drawings. In the drawings, like reference characters have been used to designate identical or equivalent elements. FIG. 9 is a plan view illustrating a semiconductor device according to the present embodiment, and specifically, a semiconductor device including a JFET. FIG. 10A is a cross-sectional view along the line A-A of FIG. 9, and FIG. 10B is a cross-sectional view along the line B-B of FIG. 9.

Figure 10B:
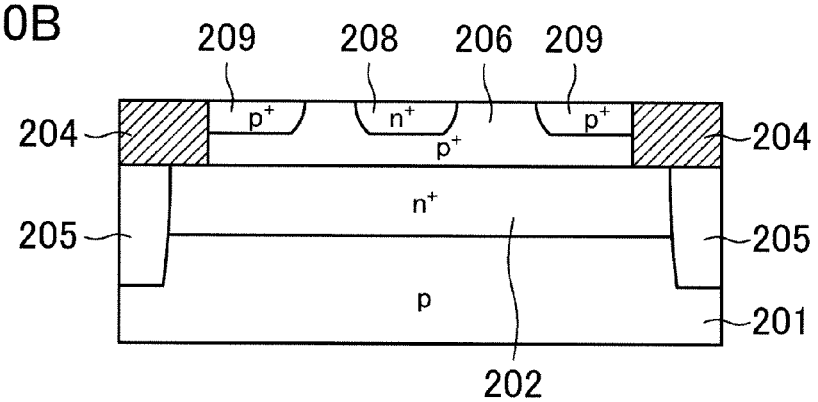
FIG. 10B is a cross-sectional view along the line B-B of FIG. 9.

As illustrated in FIG. 9 and FIGS. 10A, 10B, the semiconductor device according to the present embodiment includes a p-type channel region 206 formed in a surface portion of a p-type semiconductor substrate 201. An n-type gate region 208 is formed in a surface portion of the p-type channel region 206. P-type source/drain regions 209 are formed in parts of the surface portion of the p-type channel region 206 on both sides of the n-type gate region 208 in a channel length direction.

Moreover, in the present embodiment, n-type semiconductor regions 207 each having a higher impurity concentration than the channel region 206 are formed in parts of the p-type semiconductor substrate 201 on both sides of the p-type channel region 206 in a channel width direction. Furthermore, an n-type embedded region 202 having a higher impurity concentration than the channel region 206 is formed under the p-type channel regions 206 in the p-type semiconductor substrate 201.

Note that in the surface portion of the p-type semiconductor substrate 201, an insulating film 204 is embedded to surround the p-type channel region 206, the n-type semiconductor regions 207 (except bottom sections), the n-type gate region 208, and the p-type source/drain regions 209. Moreover, an isolation region 205 made of, for example, a low-concentration p-type semiconductor region is disposed under the insulating film 204 in the p-type semiconductor substrate 201 to surround the n-type embedded region 202 and the bottom sections of the n-type semiconductor regions 207.

In the present embodiment, the p-type semiconductor substrate 201 is, for example, a p-type silicon substrate, and has an impurity concentration of about $4 \times 10^{15}$ cm$^{-3}$. The n-type embedded region 202 is, for example, an n-type layer formed by implanting ions of an n-type impurity into the surface portion of the p-type semiconductor substrate 201, and then performing epitaxial growth of a silicon layer on the p-type semiconductor substrate 201, and has an impurity concentration of about $2 \times 10^{19}$ cm$^{-3}$. Here, the n-type embedded region 202 is defined by the isolation region 205 to be island-shaped, the isolation region 205 extending into the p-type semiconductor substrate 201. The p-type channel region 206 is, for example, a p-type layer formed by implanting a p-type impurity into a silicon layer (epitaxial layer) epitaxially grown on the n-type embedded region 202, and has an impurity concentration of about $1 \times 10^{18}$ cm$^{-3}$. The n-type semiconductor regions 207 are made of, for example, an n-type layer formed by implanting an n-type impurity into parts of the p-type semiconductor substrate 201 including the epitaxial layer on the both sides of the p-type channel region 206 in the channel width direction, and each have an impurity concentration of about $1 \times 10^{19}$ cm$^{-3}$ and a greater depth than the p-type channel region 206. The n-type gate region 208 is, for example, an n-type layer formed by implanting an n-type impurity into the surface portion of the p-type channel region 206, and has an impurity concentration of about $1 \times 10^{19}$ cm$^{-3}$.

The p-type source/drain regions 209 are made of, for example, a p-type layer formed by implanting a p-type impurity into parts of the surface portion of the p-type channel region 206 on the both sides of the n-type gate region 208 in the channel length direction, and each have an impurity concentration of about $1 \times 10^{19}$ cm$^{-3}$.

Figure 11:
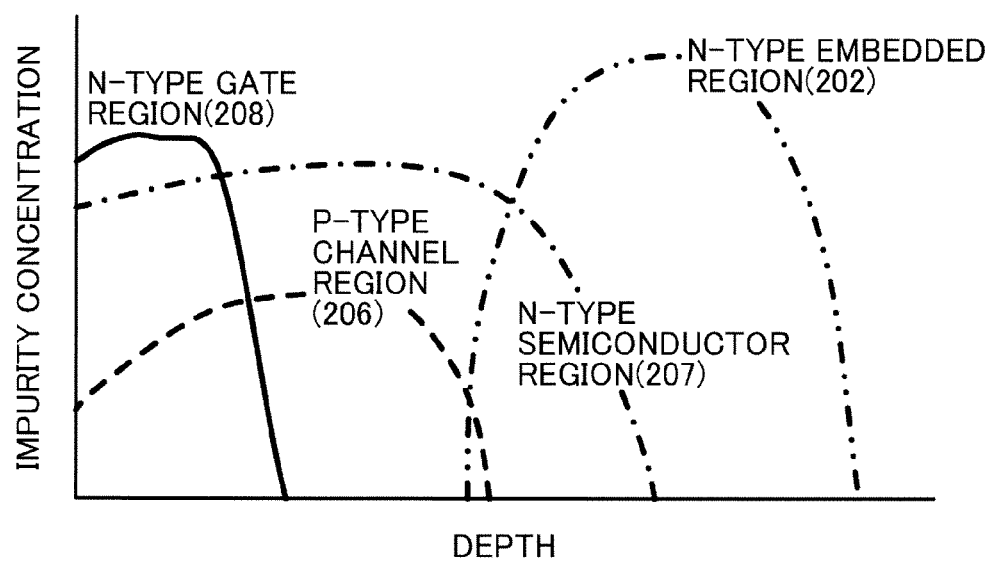
FIG. 11 is a view illustrating impurity concentration distributions in a depth direction of impurity regions of the semiconductor device according to the second embodiment.

FIG. 11 shows impurity concentration distributions in a depth direction of the n-type embedded region 202, the n-type semiconductor regions 207, the p-type channel region 206, and the n-type gate region 208 in the semiconductor device according to the present embodiment. As illustrated in FIG. 11, in the present embodiment, impurity concentrations of the n-type embedded region 202, the n-type semiconductor regions 207, and the n-type gate region 208 are each higher than the impurity concentration of the p-type channel region 206.

According to the present embodiment described above, the n-type semiconductor regions 207 each having a higher impurity concentration than the p-type channel region 206 are separately disposed on the both sides of the p-type channel region 206 in the channel width direction, and the n-type embedded region 202 having a higher impurity concentration than the p-type channel region 206 is separately disposed under the p-type channel region 206. That is, an upper surface of the p-type channel region 206 is defined by the n-type gate region 208 having a high impurity concentration and an opposite conductivity type, both side surfaces of the p-type channel region 206 are defined by the n-type semiconductor regions 207 each having a high impurity concentration and an opposite conductivity type, and further, a bottom surface of the p-type channel region 206 is defined by the n-type embedded region 202 having a high impurity concentration and an opposite conductivity type. Thus, it is possible to avoid or reduce the occurrence of a situation in which the width of the p-type channel region 206 and impurity concentration distributions in side portions of the p-type channel region 206 are influenced by variations in ion implantation for forming the n-type embedded region 202 and the n-type gate region 208 which vertically sandwich the p-type channel region 206. Moreover, the p-type channel region 206 can be surrounded in the vertical and horizontal directions by the regions having a higher impurity concentration than the p-type channel region 206 and having an opposite conductivity type, resulting in a structure in which expansion of a depletion layer in the vertical and horizontal directions of the p-type channel region 206 is ensured even at a low power supply voltage, so that it is possible to highly precisely control a pinch-off voltage. Furthermore, the p-type channel region 206 is surrounded in the vertical and horizontal directions by the regions having a high impurity concentration and having an opposite conductivity type, which enables depletion of the p-type channel region 206 at a low gate voltage, so that it is possible to reduce the pinch-off voltage.

In particular, in a JFET structure having a shallow channel depth and a large channel width, the expansion of the depletion layer on the bottom surface of the p-type channel region 206 significantly influences variations in pinch-off voltage. Thus, the advantages described above are particularly significantly achieved by using a configuration as in the semiconductor device of the present embodiment in which not only on the both side surfaces of the p-type channel region 206 but also on the bottom surface of the p-type channel region 206, an impurity region having an opposite conductivity type and a high concentration is provided.

Figure 12:
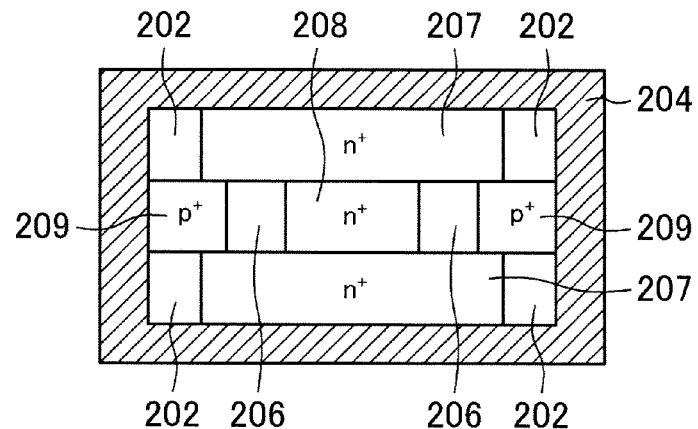
FIG. 12 is a plan view illustrating a semiconductor device according to a variation of the second embodiment.

Note that in the present embodiment, the n-type semiconductor regions 207 may be spaced apart from the p-type source/drain regions 209. With this configuration, the breakdown voltage of the JFET can be increased. Alternatively, the size of the p-type source/drain regions 209 in the channel width direction may be larger than the size of the n-type gate region 208 in the channel width direction. With this configuration, the breakdown voltage of the JFET can be increased. Note that when it is not necessary to increase the breakdown voltage, for example, as illustrated in FIG. 12 (a variation of the configuration illustrated in the plan view in FIG. 9), the n-type semiconductor regions 207 may be in contact with the p-type source/drain regions 209, or the size of the n-type gate region 208 in the channel width direction may be substantially equal to the size of the p-type source/drain regions 209 in the channel width direction.

Alternatively, in the present embodiment, the n-type gate region 208 may be spaced apart from the p-type source/drain regions 209. With this configuration, suitably setting the space between the n-type gate region 208 and the p-type source/drain regions 209 can increase the breakdown voltage while an increase in on-resistance is reduced. In this case, part of the p-type channel region 206 may lie between the n-type gate region 208 and the p-type source/drain regions 209 as in the present embodiment.

Figure 13:
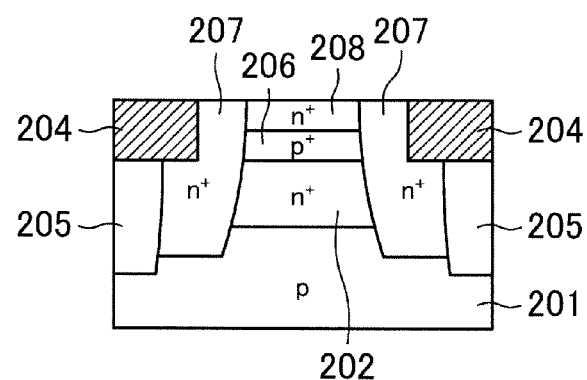
FIG. 13 is a cross-sectional view of a semiconductor device according to a variation of the second embodiment.

Alternatively, in the present embodiment, the n-type semiconductor regions 207 may each be formed to have a greater depth than the p-type channel region 206. With this configuration, the advantages described above can be ensured. In this case, when the n-type semiconductor regions 207 are each formed to have a greater depth than the n-type embedded region 202, the breakdown voltage of the JFET can be increased. Note that when it is not necessary to increase the breakdown voltage, for example, as illustrated in FIG. 13 (a variation of the cross-sectional configuration of FIG. 10A), the n-type semiconductor regions 207 may each have a greater depth than the n-type embedded region 202.

Figure 14:
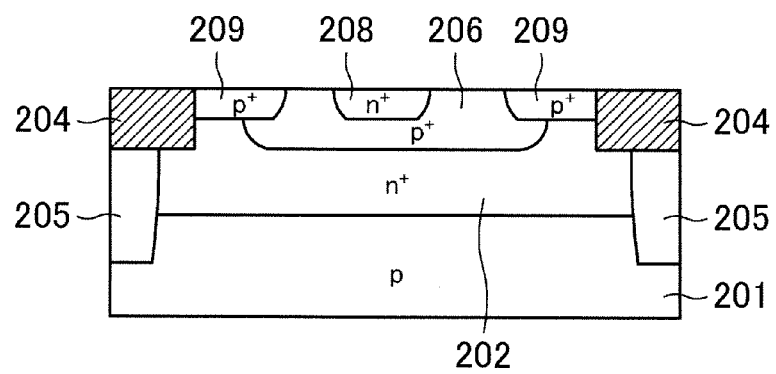
FIG. 14 is a cross-sectional view of a semiconductor device according to a variation of the second embodiment.

In the present embodiment, the p-type channel region 206 lies between the n-type embedded region 202 and the p-type source/drain regions 209 as illustrated in FIG. 10B. However, alternatively, as illustrated in FIG. 14 (a variation of the cross-sectional configuration of FIG. 10B), part of the p-type source/drain regions 209 may be in contact with the n-type embedded region 202.

In the present embodiment, the n-type embedded region 202 under the p-type channel region 206 is formed by epitaxial growth of a silicon layer. However, alternatively, selective ion implantation may be used to form an n-type embedded region 202 having a higher impurity concentration than the p-type channel region 206 and having an opposite conductivity type.

In the present embodiment, the insulating film 204 is embedded in the surface portion of the p-type semiconductor substrate 201 (to be precise, in a silicon layer epitaxially grown on the p-type semiconductor substrate 201) to a depth substantially equal to the depth of the p-type channel region 206. However, alternatively, the insulating film 204 may be embedded to a depth greater than or shallower than the depth of the p-type channel region 206.

In the present embodiment, under the insulating film 204 in the p-type semiconductor substrate 201, the isolation region 205 made of a low-concentration p-type semiconductor region is formed, but instead of the isolation region 205, for example, an isolation region made of an undoped polysilicon region covered with a silicon oxide film may be formed.

Alternatively, in the present embodiment, for example, as illustrated in FIG. 11, the impurity concentration of the n-type gate region 208 may be higher than the impurity concentration of the p-type channel region 206. With this configuration, the advantages described above can be ensured. Moreover, in this case, for example, as illustrated in FIG. 11, the impurity concentration of the n-type gate region 208 may be higher than the impurity concentration of the n-type semiconductor regions 207. Alternatively, the peak value of the impurity concentration of the n-type gate region 208 may be substantially equal to the peak value of the impurity concentration of the n-type semiconductor regions 207. With this configuration, the control of the expansion of the depletion layer can be ensured.

In the present embodiment, the p-type semiconductor substrate 201 is used, but an intrinsic semiconductor substrate or insulating substrate which includes a p-type semiconductor region formed on its surface may be used instead of the p-type semiconductor substrate 201.

In the present embodiment, the channel region and the source/drain regions each have a p-type conductivity, and the gate region and the semiconductor regions under and on the sides of the channel region each have an n-type conductivity. However, alternatively, the channel region and the source/drain regions may each have the n-type conductivity, and the gate region and semiconductor regions under and on the sides of the channel region may each have the p-type conductivity. This also provides advantages similar to those of the present embodiment.

Moreover, it is clearly understood that in the present embodiment, detailed conditions such as presence of surface protective film in performing ion implantation, the type and thickness of a mask material, and the type and thickness of an interlayer insulating film are not particularly limited.

A method for fabricating a semiconductor device according to the present embodiment will be described below with reference to the drawings, where a configuration in which the above-described JFET of the present embodiment and an NPN bipolar transistor are formed on an identical substrate is taken as an example.

In the method for fabricating the semiconductor device according to the present embodiment, the n-type semiconductor regions 207 located on the both sides of the p-type channel region 206 in the channel width direction of the JFET of the present embodiment of FIG. 9 and FIGS. 10A, 10B are formed simultaneously with a collector region of the NPN bipolar transistor by implanting an n-type impurity, and the n-type embedded region 202 located under the p-type channel region 206 of the JFET is formed simultaneously with an embedded region of the NPN bipolar transistor by epitaxial growth of a silicon layer. With this method, the JFET of the present embodiment and the NPN bipolar transistor can be formed simultaneously without adding a new step.

FIGS. 15A-15F, FIGS. 16A-16F, and FIGS. 17A, 17B are cross-sectional views illustrating steps in the method for fabricating the semiconductor device according to the present embodiment. FIGS. 15A, 15C, 15E, FIGS. 16A, 16C, 16E, and FIG. 17A illustrate a cross-sectional configuration of the JFET in the channel width direction together with a cross-sectional configuration of the NPN bipolar transistor. FIGS. 15B, 15D, 15F, FIGS. 16B, 16D, 16F, and FIG. 17 illustrate a cross-sectional configuration of the JFET in the channel length direction. Note that in FIGS. 15A-15F, FIGS. 16A-16F, and FIGS. 17A, 17B, the same reference numerals as those of FIG. 9 and FIGS. 10A, 10B are used to represent equivalent elements of the semiconductor device of the embodiments illustrated in FIG. 9 and FIGS. 10A, 10B.

Figure 15A:
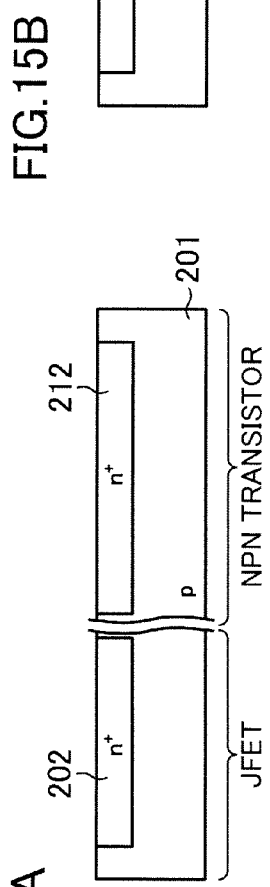
FIGS. 15A-15F are cross-sectional views illustrating steps in a method for fabricating the semiconductor device according to the second embodiment.
Figure 15B:
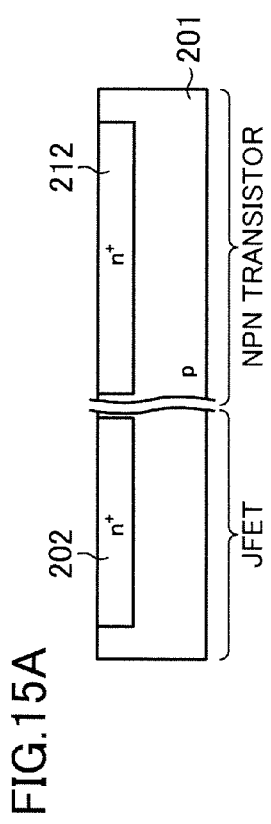

In the present embodiment, first, in a first step, as illustrated in FIGS. 15A and 15B, ions of an n-type impurity are selectively implanted into a JFET formation region and an NPN bipolar transistor formation region of a p-type semiconductor substrate 201 under the conditions, for example, that a dose amount is $5 \times 10^{15}$ cm$^{-2}$, and an implantation energy is 30 keV, thereby forming an n-type embedded region 202 and an n-type embedded region 212.

Figure 15C:
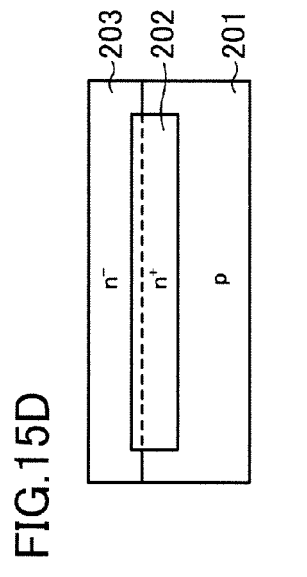
Figure 15D:
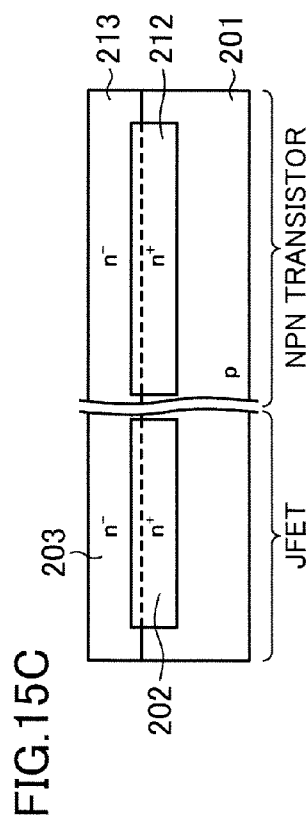

Next, in a second step, as illustrated in FIGS. 15C and 15D, for example, an n-type silicon layer is epitaxially grown, for example, at about 1100° C. on the p-type semiconductor substrate 201, thereby forming an n-type epitaxial layer 203 in a surface portion of the p-type semiconductor substrate 201 of the JFET formation region, and an n-type epitaxial layer 213 in a surface portion of the p-type semiconductor substrate 201 of the NPN bipolar transistor formation region. Here, the n-type epitaxial layer 203 and the n-type epitaxial layer 213 each have a thickness of, for example, about 0.4 μm. Moreover, in forming the n-type epitaxial layer 203 and the n-type epitaxial layer 213, the n-type embedded region 202 of the JFET formation region and the n-type embedded region 212 of the NPN bipolar transistor formation region grow by about a thickness of 0.1 μm in the n-type epitaxial layer 203 and the n-type epitaxial layer 213, as a result of which the n-type embedded region 202 and the n-type embedded region 212 each have a thickness of about 0.5 μm.

Figure 15E:
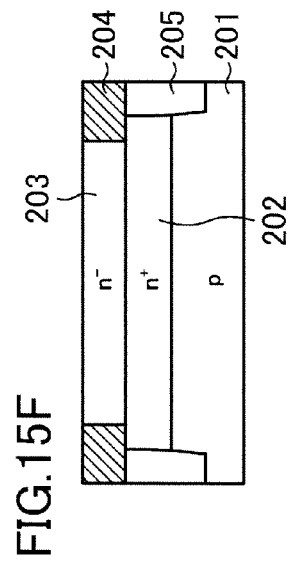
Figure 15F:
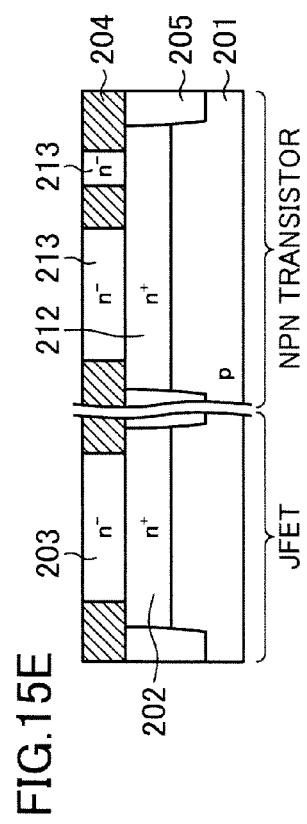

Next, in a third step, as illustrated in FIGS. 15E and 15F, an insulating film 204 is embedded in the surface portion in a predetermined region of the p-type semiconductor substrate 201, and an isolation region 205 is formed under the insulating film 204 in the p-type semiconductor substrate 201 by using, for example, a processing technique such as trench etching. Thus, the JFET formation region is electrically isolated from the NPN bipolar transistor formation region.

Next, in a fourth step, as illustrated in FIGS. 16A and 16B, ions of a p-type impurity are selectively implanted into a surface portion of the n-type epitaxial layer 203 of the JFET formation region and a surface portion of the n-type epitaxial layer 213 of the NPN bipolar transistor formation region under the conditions, for example, that the dose amount is $2 \times 10^{12}$ cm$^{-2}$, and the implantation energy is 40 keV. Thus, a p-type channel region 206 is formed in the n-type epitaxial layer 203 of the JFET formation region to reach the n-type embedded region 202, and a p-type base region 216 is formed in the n-type epitaxial layer 213 of the NPN bipolar transistor formation region to reach the n-type embedded region 212. Here, the p-type channel region 206 and the p-type base region 216 each have a thickness of, for example, about 0.3 μm.

Next, in a fifth step, as illustrated in FIGS. 16C and 16D, ions of an n-type impurity are selectively implanted into both end portions of the n-type epitaxial layer 203 in the channel width direction including the p-type channel region 206 of the JFET formation region and a part of the n-type epitaxial layer 213 of the NPN bipolar transistor formation region in which the p-type base region 216 is not formed under the conditions, for example, that the dose amount is $5 \times 10^{15}$ cm$^{-2}$, and the implantation energy is 80 keV. Thus, n-type semiconductor regions 207 are formed in the both end portions of the p-type channel region 206 in the channel width direction of the JFET formation region to have a greater depth than the p-type channel region 206, and an n-type collector region 217 is formed in the part of the n-type epitaxial layer 213 of the NPN bipolar transistor formation region in which the p-type base region 216 is not formed. Here, the n-type semiconductor regions 207 and the n-type collector region 217 are respectively formed to have a greater depth than the n-type epitaxial layer 203 and the n-type epitaxial layer 213 by, for example, about 0.4 μm.

Next, in a sixth step, as illustrated in FIGS. 16E and 16F, ions of an n-type impurity are selectively implanted into a surface portion of the p-type channel region 206 of the JFET formation region and surface portions of the p-type base region 216 and the n-type collector region 217 of the NPN bipolar transistor formation region under the conditions, for example, that the dose amount is $4 \times 10^{15}$ cm$^{-2}$, and the implantation energy is 50 keV. Thus, an n-type gate region 208 is formed in the surface portion of the p-type channel region 206 of the JFET formation region, and an n-type emitter region 218 and an n-type collector contact region 228 are respectively formed in a surface portion of the p-type base region 216 and a surface portion of the n-type collector region 217 of the NPN bipolar transistor formation region. Here, the n-type gate region 208, the n-type emitter region 218, and the n-type collector contact region 228 each have a thickness of, for example, about 0.15 μm.

Figure 17B:
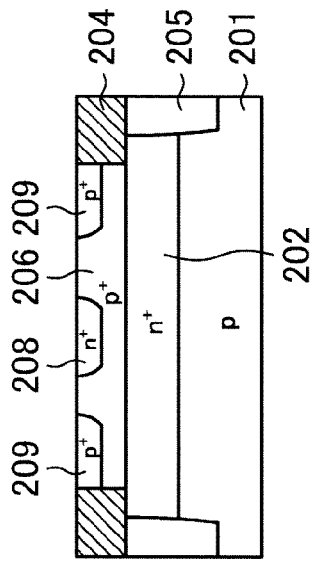
FIGS. 17A and 17B are cross-sectional views illustrating a step of the method for fabricating the semiconductor device according to the second embodiment.
Figure 17A:
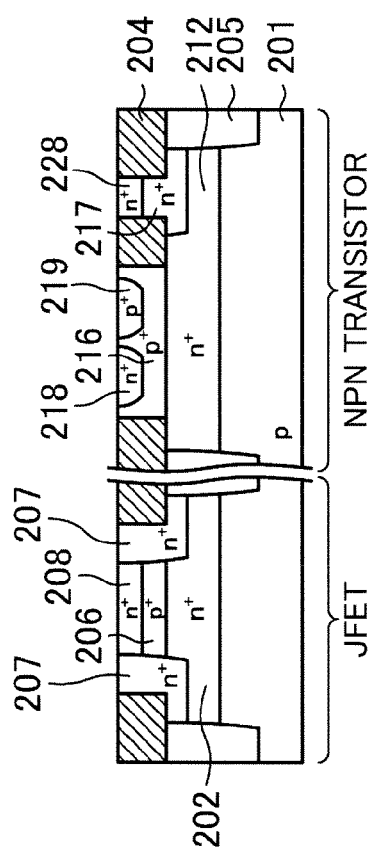
Figure 18:
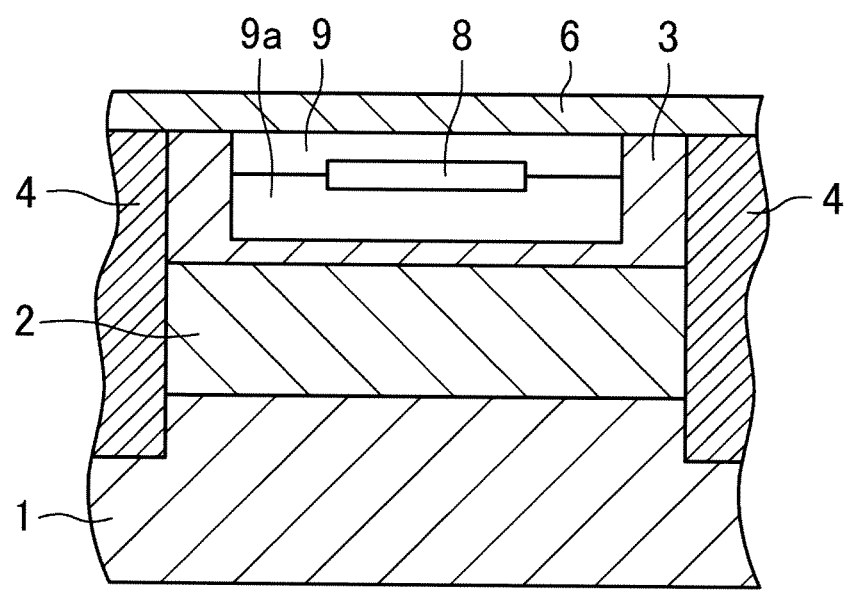
FIG. 18 is a cross-sectional view illustrating a semiconductor device in the background.

Next, in a seventh step, as illustrated in FIGS. 17A and 17B, ions of a p-type impurity are selectively implanted into parts of the surface portion of the p-type channel region 206 of the JFET formation region on both sides of the n-type gate region 208 in the channel length direction and a part of the surface portion of the p-type base region 216 of the NPN bipolar transistor formation region in which the n-type emitter region 218 is not formed, where the implantation is performed under the conditions, for example, that the dose amount is $4 \times 10^{15}$ cm$^{-2}$, and the implantation energy is 3 keV. Thus, p-type source/drain regions 209 are formed in the parts of the surface portion of the p-type channel region 206 of the JFET formation region on the both sides of the n-type gate region 208 in the channel length direction, and a p-type base contact region 219 is formed in the part of the surface portion of the p-type base region 216 of the NPN bipolar transistor formation region in which the n-type emitter region 218 is not formed. Here, the p-type source/drain regions 209 and the p-type base contact region 219 each have a thickness of about 0.2 µm.

Through the steps described above, the NPN bipolar transistor including the n-type embedded region 212, the p-type base region 216, the n-type collector region 217, the n-type emitter region 218, the n-type collector contact region 228, and the p-type base contact region 219 is formed on the p-type semiconductor substrate 201 together with the JFET of the present embodiment of FIG. 9 and FIGS. 10A, 10B.

As described above, according to the fabrication method in the present embodiment, the n-type semiconductor regions 207 which are located on the both sides of the p-type channel region 206 in the channel width direction of the JFET of the present embodiment, and have a high impurity concentration can be formed simultaneously with the n-type collector region 216 of the NPN bipolar transistor, and the n-type embedded region 202 located under the p-type channel region 206 of the JFET of the present embodiment can be formed simultaneously with the embedded region 212 of the NPN bipolar transistor. Thus, a semiconductor device including the JFET of the present embodiment and a bipolar transistor formed on an identical substrate can be obtained without adding a new step.

Note that in the fabrication method in the present embodiment, the n-type embedded region 202 of the JFET and the n-type embedded region 212 of the NPN bipolar transistor are formed by epitaxial growth of a silicon layer. However, alternatively, selective ion implantation may be used to form the n-type embedded region 202 of the JFET and the n-type embedded region 212 of the NPN bipolar transistor.

Note that in the fabrication method in the present embodiment, the channel region and the source/drain regions of the JFET, and the base region and the base contact region of the bipolar transistor are each have a p-type conductivity, and the gate region and the semiconductor regions under and on the sides of the channel region of the JFET, and the collector region, the emitter region, and the collector contact region of the bipolar transistor each have an n-type conductivity. However, alternatively, the channel region and the source/drain regions of the JFET, and the base region and the base contact region of the bipolar transistor may each have the n-type conductivity, and the gate region and the semiconductor regions under and on the sides of the channel region of the JFET, and the collector region, the emitter region, and the collector contact region of the bipolar transistor may each have the p-type conductivity. This also provides advantages similar to those of the present embodiment. That is, instead of the NPN bipolar transistor, a PNP bipolar transistor may be formed together with the JFET.

Moreover, it is clearly understood that in the fabrication method in the present embodiment, detailed conditions such as presence of a surface protective film in performing ion implantation, the type and thickness of a mask material, the type and thickness of an interlayer insulating film are not particularly limited.

As described above, the present disclosure has the advantages that a JFET capable of highly precisely controlling a pinch-off voltage and reducing a pinch-off voltage can be obtained, and is useful, for example, for low noise semiconductor devices and methods for fabricating the same.

What is claimed is:

1. A semiconductor device comprising:
    a channel region disposed in a surface portion of a semiconductor substrate and having a first conductivity type;
    a first semiconductor region disposed under the channel region in the semiconductor substrate and having a second conductivity type;
    a gate region disposed in a surface portion of the channel region and having the second conductivity type; and
    source/drain regions disposed in parts of the surface portion of the channel region on both sides of the gate region in a channel length direction and having the first conductivity type, wherein
    second semiconductor regions having a higher impurity concentration than the first semiconductor region and having the second conductivity type are further disposed in parts of the semiconductor substrate on both sides of the channel region in a channel width direction, and
    the second semiconductor regions each have a shallower depth than the first semiconductor region.

2. The semiconductor device of claim 1, wherein the second semiconductor regions have a greater depth than the channel region.

3. The semiconductor device of claim 1, wherein the gate region is spaced apart from the source/drain regions.

4. The semiconductor device of claim 1, wherein the second semiconductor regions are spaced apart from the source/drain region.

5. The semiconductor device of claim 1, wherein a size of the source/drain regions in the channel width direction is larger than a size of the gate region in the channel width direction.

6. The semiconductor device of claim 1, wherein an impurity concentration of the gate region is higher than an impurity concentration of the first semiconductor region.

7. The semiconductor device of claim 6, wherein a peak value of the impurity concentration of the gate region is substantially equal to a peak value of the impurity concentration of each of the second semiconductor regions.

8. The semiconductor device of claim 1, further comprising:
    a bipolar transistor disposed on the semiconductor substrate.

9. A semiconductor device comprising:
    a channel region disposed in a surface portion of a semiconductor substrate and having a first conductivity type;
    a gate region disposed in a surface portion of the channel region and having a second conductivity type; and
    source/drain regions disposed in parts of the surface portion of the channel region on both sides of the gate region in a channel length direction and having the first conductivity type, wherein
    semiconductor regions having a higher impurity concentration than the channel region and having the second conductivity type are disposed in parts of the semiconductor substrate on both sides of the channel region in a channel width direction, and
    an embedded region having a higher impurity concentration than the channel region and having the second conductivity type is disposed under the channel region in the semiconductor substrate.

10. The semiconductor device of claim 9, wherein the semiconductor regions have a greater depth than the channel region.

11. The semiconductor device of claim 10, wherein the semiconductor regions have a shallower depth than the embedded region.

12. The semiconductor device of claim 9, wherein the gate region is spaced apart from the source/drain regions.

13. The semiconductor device of claim 9, wherein the semiconductor regions are spaced apart from the source/drain regions.

14. The semiconductor device of claim 9, wherein a size of the source/drain region in the channel width direction is greater than a size of the channel width direction in the gate region.

15. The semiconductor device of claim 9, wherein an impurity concentration of the gate region is higher than an impurity concentration of the channel region.

16. The semiconductor device of claim 15, wherein a peak value of the impurity concentration of the gate region is substantially equal to a peak value of the impurity concentration of each of the semiconductor regions.

17. The semiconductor device of claim 9, further comprising:
   a bipolar transistor disposed on the semiconductor substrate.

18. The semiconductor device of claim 1, wherein the channel region is spaced apart from the semiconductor substrate by the first semiconductor region.

19. The semiconductor device of claim 9, wherein the channel region is spaced apart from the semiconductor substrate by the embedded region.

\* \* \* \* \*